United States Patent
Yong et al.

(10) Patent No.: US 8,685,861 B2
(45) Date of Patent: Apr. 1, 2014

(54) INTEGRATED CIRCUIT SYSTEM WITH CONTACT DISTRIBUTION FILM

(75) Inventors: Chih Ping Yong, Singapore (SG); Peter Chew, Singapore (SG); Chuin Boon Yeap, Singapore (SG); Hoon Lian Yap, Singapore (SG); Ranbir Singh, Singapore (SG); Nace Rossi, Singapore (SG); Jovin Lim, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 1763 days.

(21) Appl. No.: 11/462,036

(22) Filed: Aug. 2, 2006

(65) Prior Publication Data

US 2008/0029853 A1     Feb. 7, 2008

(51) Int. Cl.
*H01L 21/311* (2006.01)
(52) U.S. Cl.
USPC .................................. 438/701; 257/E21.578
(58) Field of Classification Search
USPC ........... 257/637, E21.577, E21.578; 438/701, 438/702, 713
See application file for complete search history.

(56) References Cited

U.S. PATENT DOCUMENTS

| | | | |
|---|---|---|---|
| 3,673,679 A * | 7/1972 | Carbajal et al. | 438/227 |
| 4,814,041 A * | 3/1989 | Auda | 438/712 |
| 5,702,981 A | 12/1997 | Maniar et al. | |
| 5,883,436 A * | 3/1999 | Sadjadi et al. | 257/760 |
| 6,228,777 B1 | 5/2001 | Arafa et al. | |
| 6,458,657 B1 * | 10/2002 | Chang | 438/257 |
| 6,693,042 B1 | 2/2004 | Sedigh et al. | |
| 6,706,638 B2 * | 3/2004 | Yang et al. | 438/706 |
| 6,784,084 B2 | 8/2004 | Kang et al. | |
| 6,791,138 B2 * | 9/2004 | Weimer et al. | 257/306 |
| 6,890,863 B1 | 5/2005 | Donohoe et al. | |
| 7,714,392 B2 * | 5/2010 | Chang et al. | 257/369 |

* cited by examiner

*Primary Examiner* — Laura M Menz
*Assistant Examiner* — Candice Y Chan
(74) *Attorney, Agent, or Firm* — Ishimaru & Associates LLP

(57) ABSTRACT

A integrated circuit system including providing an integrated circuit device, forming an undoped insulating layer over the integrated circuit device, forming a thin insulating layer over the undoped insulating layer, forming a doped insulating layer over the thin insulating layer, and forming a contact in the undoped insulating layer, thin insulating layer and the doped insulating layer.

8 Claims, 4 Drawing Sheets

INTEGRATED CIRCUIT SYSTEM WITH CONTACT DISTRIBUTION FILM

TECHNICAL FIELD

The present invention relates generally to integrated circuit systems, and more particularly to a system for an integrated circuit with contact film.

BACKGROUND ART

Integrated circuits devices are used in many applications including portable electronic products, such as cell phone, portable computers, voice recorders, etc. as well as in many larger systems with electronic components, such as cars, planes, industrial control systems, etc. Across virtually all these applications, there continues to be a continuous, strong demand for increasing features while reducing the area required for the electronic devices or components. The intense demand is no more visible than in the portable electronic devices and products that have become so commonplace in everyday life.

In the manufacture of integrated circuit devices, it is necessary to provide many electrically conductive contacts and interconnect layers in order to connect electrically various parts of the device to each other and to external circuitry. As manufacturers of integrated circuit devices have continued their efforts in attempts to meet the needs of further reductions in the size of the devices, many have attempted to improve density, such as by reducing the size of the electrical contacts as well as the interconnect pitch and dimensions. Reducing the size of electrical contacts, interconnect size and dimensions must be accomplished without reducing the reliability of the devices as well as keeping the surface planar so that subsequent interconnect layers can be formed.

Conventional methods of depositing metal contacts, such as by sputtering, have great difficulty in depositing enough material into the contact holes in order to form reliable electrical connections between semiconductor layers and the metal contact. In addition, the resulting topology is non-planar and can place severe constraints on the complexity of the interconnect layers. This method of manufacturing has the limitation that the contact hole must be wide enough and have the correct profile to allow a limited amount of metal to enter the contact hole to form the contact. The obtainable reduction in size of the contact hole is limited by the step coverage capability of conventional sputtering systems.

The aspect ratio of the electrical contacts, such as a through-hole or window, for connecting upper-layer and lower-layer semiconductors formed on a substrate is increased as the integrated circuit devices are further refined and more densely integrated. This increases the difficulty of depositing sufficient metal to enter the contact hole forming the contact between semiconductor layers. Some attempts to provide the electrical connections include embedding a plug in the electrical contacts having a high aspect ratio. Many attempts suffer from poor performance, high rates of defects, and difficulty controlling production processes.

Tungsten contact shorting is one such problem that results in all of these issues. Lateral etching of the contact opening may be caused by an incorrectly mixed initial layer. The incorrect mixture may be caused by injector valve clogging or an initial outburst of one of the materials to be deposited. The incorrect mixture creates an interface area where the chemical bonds are weaker and easier to break. Etching then processes at a higher rate providing a region for the tungsten contact to penetrate laterally. The lateral penetration results in poor performance, high rates of defects, difficulty controlling production processes and shorting.

Thus, a need still remains for an integrated circuit system with contact film to provide increasing density without sacrificing reliability, performance, yield, and high volume manufacturability. In view of the increasing demand for continued density improvements in electronic components and systems, particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides integrated circuit system including providing an integrated circuit device, forming an undoped insulating layer over the integrated circuit device, forming a thin insulating layer over the undoped insulating layer, forming a doped insulating layer over the thin insulating layer, and forming a contact in the undoped insulating layer, thin insulating layer and the doped insulating layer.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
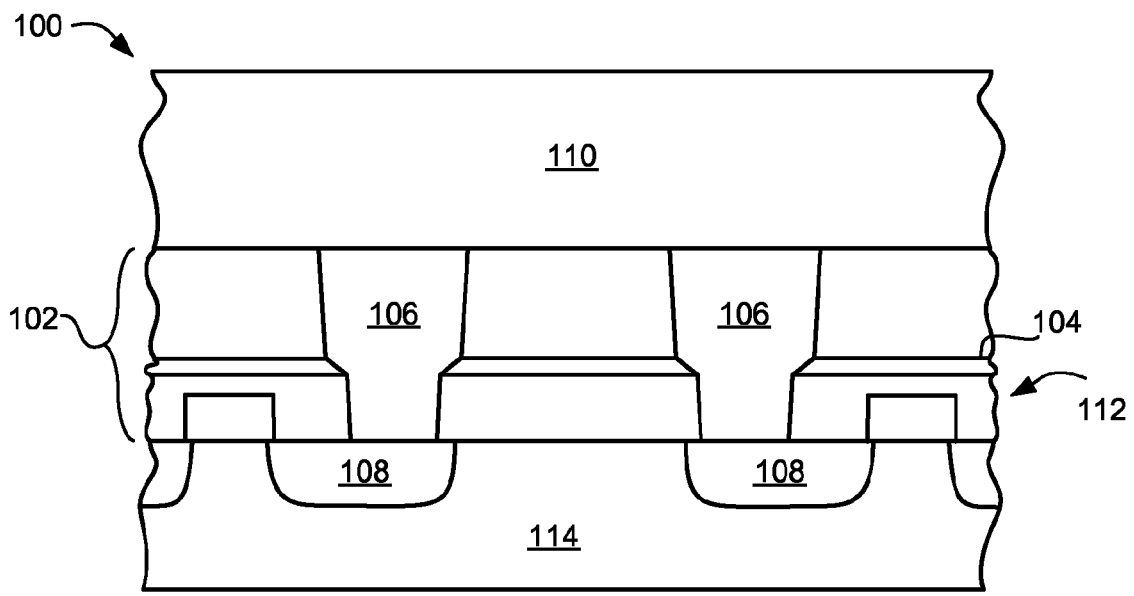
FIG. 1 is a cross-sectional view of an integrated circuit system with contact film in an embodiment of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit system with contact film 100 in an embodiment of the present invention. The integrated circuit system with contact film 100 includes a dielectric 102, such as an ILD (interlayer dielectric), having a lightly doped thin insulating layer 104, such as a contact film oxide with less than 2.5% phosphorous wt %, and a contact 106. The lightly doped thin insulating layer 104 reduces initial dopant flow bursting thereby reducing unvaporized dopant flow.

Reducing unvaporized dopant flow reduces the formation of a higher than expected dopant level in the lightly doped thin insulating layer 104. The expected dopant level in the dielectric 102 provides controlled preparation, such as cleaning, of a recess (not shown) etched in the dielectric 102 for the contact 106. The controlled preparation provides reliability and electrical isolation of the contact 106 by reducing wet clean lateral etch that may cause a lateral penetration of the contact 106. The lateral penetration may result in shorting with other semiconductors or another of the contact 106.

The contact 106 connects an interconnect layer 110, such as metal, with a semiconductor layer 108, such as an active layer, a polysilicon layer or another metal layer. The semiconductor layer 108 may be part of an integrated circuit device 112 formed over a substrate 114. The contact 106 is deposited, such as CVD (chemical vapor deposition), into the recess etched in the dielectric 102, wherein the recess extends to the semiconductor layer 108. A barrier layer (not shown) or a conductive layer (not shown) may be partly applied to the recess. The interconnect layer 110 is applied, such as sputtering, over the contact 106, wherein the interconnect layer 110 electrically connects to the contact 106. The interconnect layer 110 may be further processed, such as etching, to form connection traces.

Figure 2:
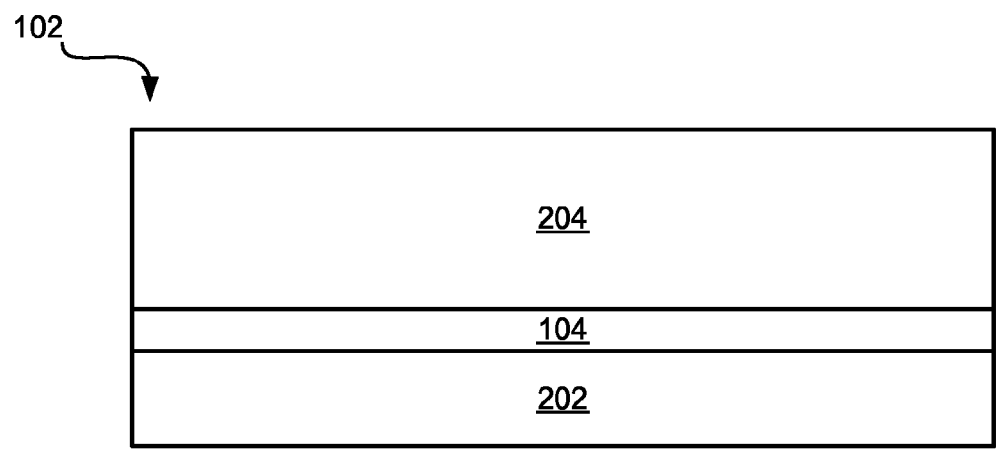
FIG. 2 is a cross-sectional view of the dielectric.

Referring now to FIG. 2, therein is shown a cross-sectional view of the dielectric 102. The dielectric 102 includes multiple layers of insulating materials, such as TEOS (tetraethoxysilane, tetraethylorthosilicate or similar based materials). The dielectric 102 is deposited in a multi-step process, such as a 2-step recipe, through a deposition system, such as an injection delivery system or liquid injection system. Dopants combine with the dielectric 102 during deposition to form doped TEOS, such as BPSG (boron phosphorous silicon glass or similar based material) and PEPSG (plasma enhanced phososilicate glass or similar based material).

The lightly doped thin insulating layer 104 is deposited between an undoped insulating layer 202 and a doped insulating layer 204. The doped insulating layer 204 is doped with a bulk flow of TEPO (triethylphosphine oxide, triethylphosphate or similar based material) or TEP (triethylphosphine or similar based material) for phosphorous. For boron, the doped insulating layer 204 is doped with a bulk flow of TEB (triethylborate) or TMB (trimethoxyborane or trimethylborate).

The lightly doped thin insulating layer 104 is less than 1000 angstroms in thickness and doped with 30% to 50% of the bulk flow of dopant, TEPO, TEP, TEB or TMB. The lower dopant flow setpoint for the lightly doped thin insulating layer 104 minimizes non-vaporization volume and maximizes vaporization rates to reduce the effects of precursor flow overshoot, poor vaporization of dopant precursors and dopant precursor condensation. The lower dopant flow setpoint thereby reduces the formation of a higher than expected dopant level in the lightly doped thin insulating layer 104.

Figure 3:
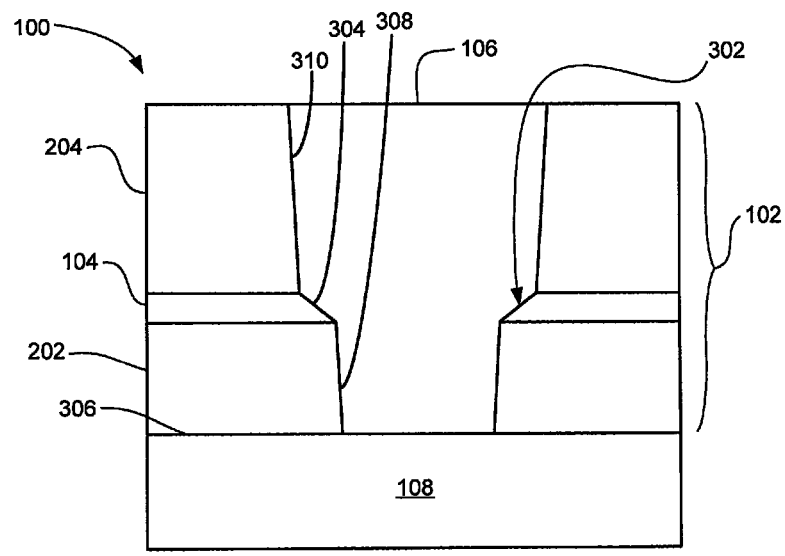
FIG. 3 is a cross-sectional view of the integrated circuit system with contact film from a region near the center of the wafer.

Referring now to FIG. 3, therein is shown a cross-sectional view of the integrated circuit system with contact film 100 from a region near the center of the wafer (not shown). The dielectric 102 includes the lightly doped thin insulating layer 104 deposited between the undoped insulating layer 202 and the doped insulating layer 204. The recess (not shown) is etched with controlled preparation into the dielectric 102, providing a graduated profile 302 through the lightly doped thin insulating layer 104, the undoped insulating layer 202 and the doped insulating layer 204. In at least one embodiment, the graduated profile 302 can include a lightly doped thin insulating layer sidewall 304 with an angled boundary or profile that can be sloped less than (as determined by reference to the horizontal plane established by a top surface 306 of the substrate 108) the angled boundary or profile of each of an undoped insulating layer sidewall 308 and a doped insulating layer sidewall 310. Generally, the recess can be formed through the dielectric 102, and in at least one embodiment, the recess can be formed by etching or removing only the lightly doped thin insulating layer 104, the undoped insulating layer 202 and the doped insulating layer 204. The contact 106 is deposited into the recess and forms the graduated profile 302 providing reliability and electrical isolation of the contact 106 as well as electrical connectivity between the interconnect layer 110 of FIG. 1 and the semiconductor layer 108.

An aggressive preparation process, including a 200 second clean time instead of a 130 second clean time, was applied to the recess. Performance of the integrated circuit device 112 including the integrated circuit system with contact film 100 were substantially unchanged from integrated circuit devices (not shown) without the integrated circuit system with contact film 100 based on electrical test and sort yield.

Figure 4:
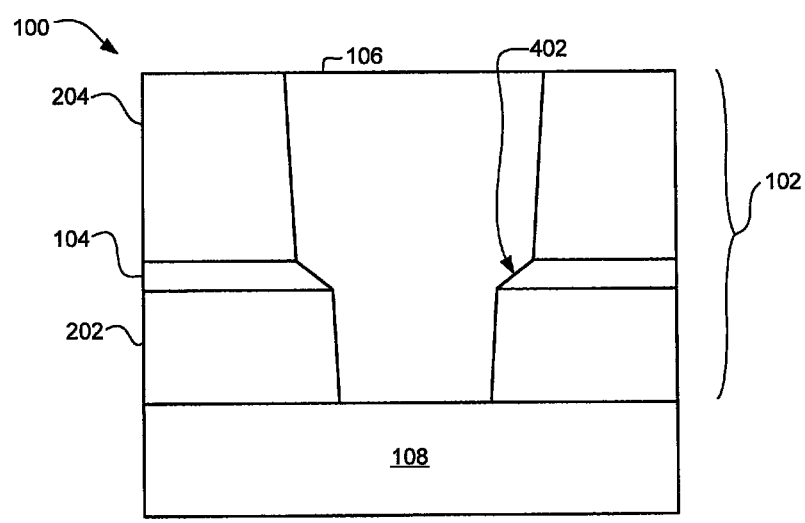
FIG. 4 is a cross-sectional view of the integrated circuit system with contact film from a region near the edge of the wafer.

Referring now to FIG. 4, therein is shown a cross-sectional view of the integrated circuit system with contact film 100 from a region near the edge of the wafer (not shown). In a manner substantially the same as FIG. 3, the dielectric 102 includes the lightly doped thin insulating layer 104 deposited between the undoped insulating layer 202 and the doped insulating layer 204. The recess (not shown) is etched with controlled preparation into the dielectric 102, providing a graduated profile 402 through the lightly doped thin insulating layer 104, the undoped insulating layer 202 and the doped insulating layer 204. The contact 106 is deposited into the recess and forms the graduated profile 402 providing reliability and electrical isolation as well as electrical connectivity between the interconnect layer 110 of FIG. 1 and the semiconductor layer 108.

An aggressive preparation process, including a 200 second clean time instead of a 130 second clean time, was applied to the recess. Performance of the integrated circuit device 112 including the integrated circuit system with contact film 100 were substantially unchanged from integrated circuit devices (not shown) without the integrated circuit system with contact film 100 based on electrical test and sort yield.

Figure 5:
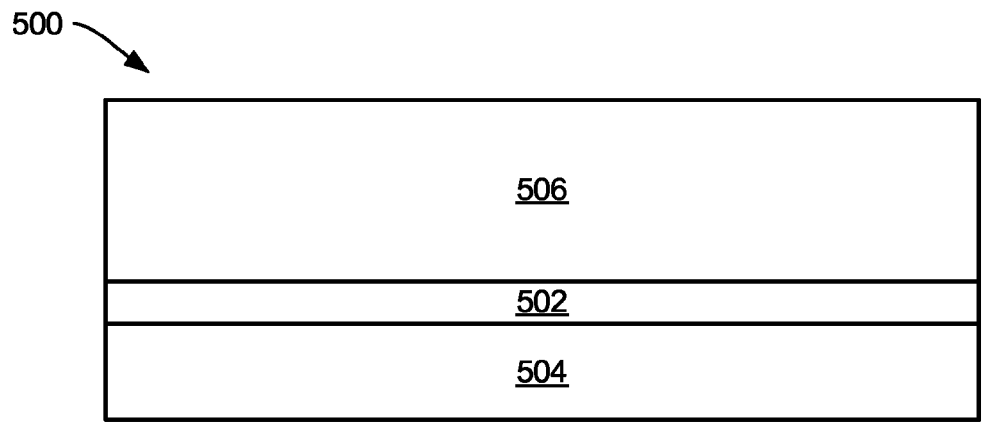
FIG. 5 is a cross-sectional view of a dielectric having an undoped thin insulating layer in an alternative embodiment of the present invention.

Referring now to FIG. 5, therein is shown a cross-sectional view of a dielectric 500 having an undoped thin insulating layer 502 in an alternative embodiment of the present invention. In a manner similar to the dielectric 102 of FIG. 2, the dielectric 500 includes multiple layers of insulating materials, such as TEOS. The dielectric 500, such as an ILD (interlayer dielectric), is deposited in a multi-step process, such as a 2-step recipe, through a deposition system, such as an injection delivery system or liquid injection system. Dopants combine with the dielectric 500 during deposition to form doped TEOS, such as BPSG and PEPSG. The undoped thin insulating layer 502, such as a contact film oxide, is deposited between an undoped insulating layer 504 and a doped insulating layer 506. The doped insulating layer 506 is doped with a bulk flow of TEPO or TEP.

The undoped thin insulating layer 502 is less than 1000 angstroms in thickness. The initial elimination of TEPO or TEP flow for the undoped thin insulating layer 502 minimizes non-vaporization volume and maximizes vaporization rates to reduce the effects of precursor flow overshoot, poor vaporization of dopant precursors and dopant precursor condensation during the bulk flow of TEPO or TEP. The initial elimination of TEPO or TEP flow thereby reduces the formation of a higher than expected dopant level in the dielectric 500.

Figure 6:
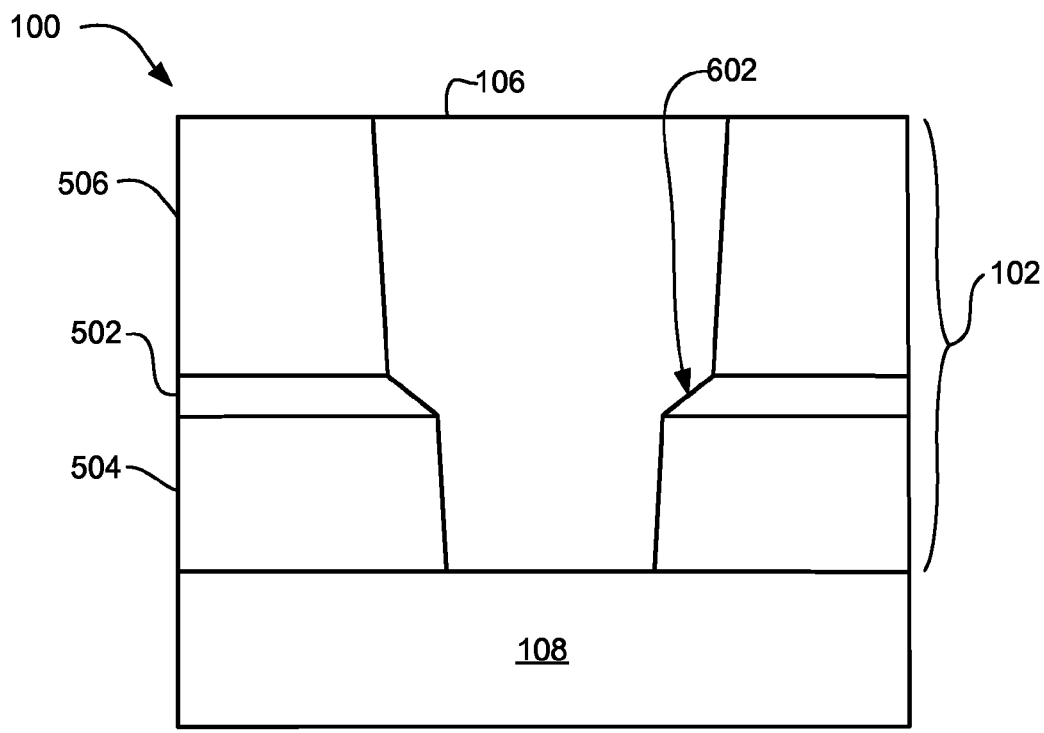
FIG. 6 is a cross-sectional view of the integrated circuit system with contact film including the dielectric in an alternative embodiment of the present invention.

Referring now to FIG. 6, therein is shown a cross-sectional view of the integrated circuit system with contact film 100 including the dielectric 500 in an alternative embodiment of the present invention. The dielectric 102 includes the undoped thin insulating layer 502 deposited between the undoped insulating layer 504 and the doped insulating layer 506. The recess (not shown) is etched with controlled preparation into the dielectric 500, providing a graduated profile 602 through the undoped thin insulating layer 502, the undoped insulating layer 504 and the doped insulating layer 506. Generally, the recess can be formed through the dielectric 102, and in at least one embodiment, the recess can be formed by etching or removing only the undoped thin insulating layer 502, the undoped insulating layer 504 and the doped insulating layer 506.

The controlled preparation provides reliability and electrical isolation of the contact 106 by reducing wet clean lateral etch that may cause a lateral penetration of the contact 106. The lateral penetration may result in shorting with other semiconductors or another of the contact 106. The contact 106 is deposited into the recess and forms the graduated profile 602 providing electrical connectivity between the interconnect layer 110 of FIG. 1 and the semiconductor layer 108.

Figure 7:
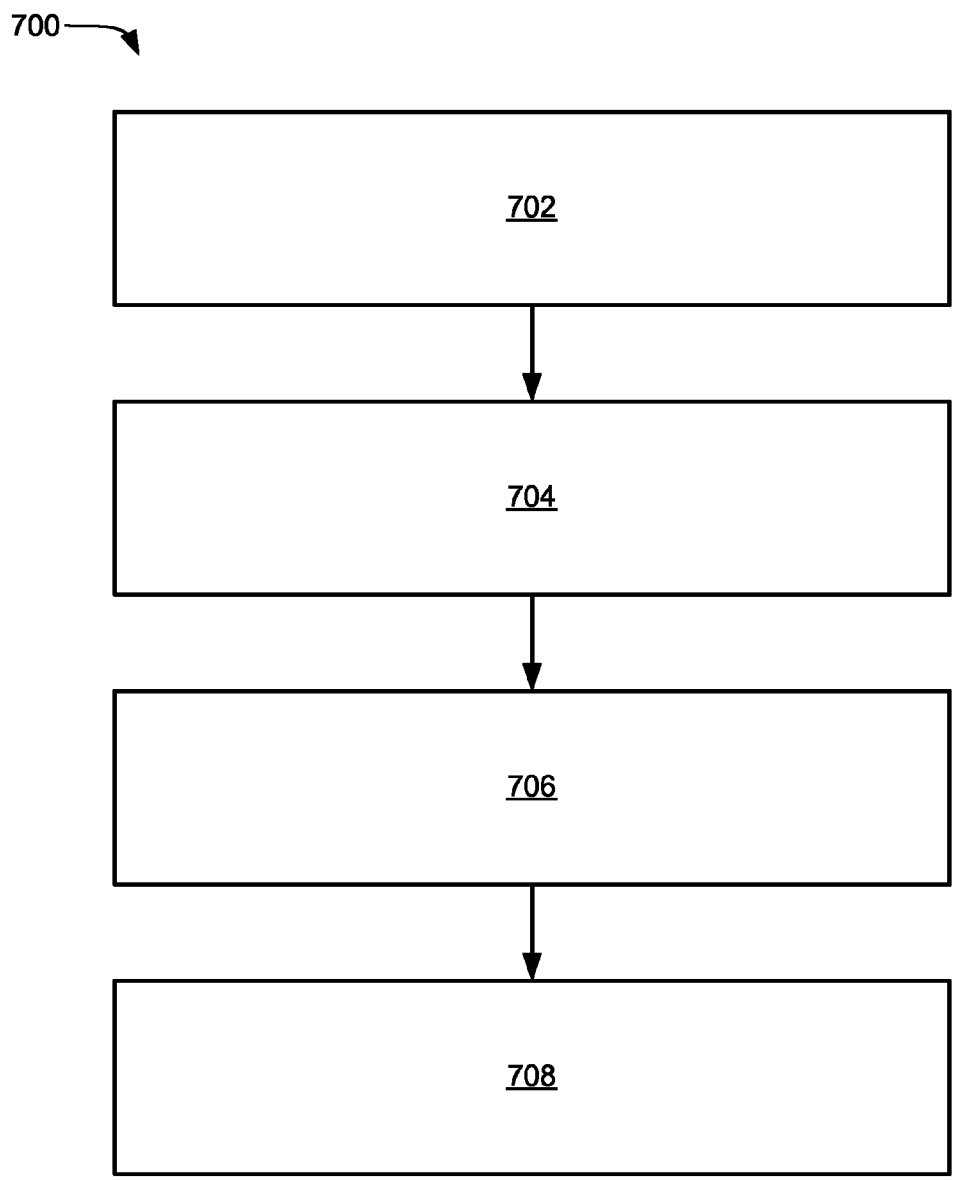
FIG. 7 is a flow chart of an integrated circuit system for manufacturing the integrated circuit system with contact film in an embodiment of the present invention.

Referring now to FIG. 7, therein is shown a flow chart of an integrated circuit system 700 for manufacturing the integrated circuit system with contact film 100 in an embodiment of the present invention. The system 700 includes providing an undoped insulating layer in a block 702; forming a thin insulating layer in a block 704; forming a doped insulating layer in a block 706; and forming a contact in the undoped insulating layer, thin insulating layer and the doped insulating layer in a block 708.

In greater detail, a method to fabricate the integrated circuit system with contact film 100, in an embodiment of the present invention, is performed as follows:
1. Forming the integrated circuit device 112 having the semiconductor layer 108 on the substrate 114. (FIG. 1)
2. Depositing the undoped insulating layer 202 over the substrate 114. (FIG. 2)
3. Depositing the thin insulating layer on the undoped insulating layer 202. (FIG. 2)
4. Depositing the doped insulating layer 204 on the thin insulating layer. (FIG. 2)
5. Depositing the contact 106 in the dielectric 102 including the undoped insulating layer 202, the thin insulating layer and the doped insulating layer 204. (FIG. 2)

It has been discovered that the present invention thus has numerous aspects.

An aspect is that the present invention improves the quality of the dielectric. Control of the dopant flow and concentration is significantly improved. The control provides improved consistency in the dopant levels or richness of the dielectric insulating layers.

It has been discovered that the disclosed structure provides compensation for variations in the deposition delivery system. The lower dopant precursor flow setpoint compensates for overshoot, poor vaporization and condensation, all of which affect the deposition delivery system's performance particularly with respect to consistency.

It has also been discovered that the disclosed structure improves the chemical bond at the interface of the undoped and doped regions. This improves the consistency of the dopant levels or richness, providing graduated doping and reduced weakening of the chemical bond between the dielectric insulating layers.

Yet another discovery of the disclosed structure is improved integrity during cleaning, such a wet etching. The improved chemical bond between the dielectric insulating layers provides more consistent surfaces for the etching process. The cleaning process removes material at a more consistent rate across the multi-surface dielectric, leaving a more planar surface.

Yet another discovery of the disclosed structure is improved yield from the reduction in contact shorting. The improved integrity during cleaning has eliminated lateral penetration of the dielectric, particularly at the insulating layer interfaces. The more planar surface of the recess and the resultant more planar surface of the contact eliminate the lateral extrusion of the contact causing shorting to adjacent contacts.

These and other valuable aspects of the present invention consequently further the state of the technology to at least the next level.

Thus, it has been discovered that the integrated circuit system with contact film method and apparatus of the present invention furnish important and heretofore unknown and unavailable solutions, capabilities, and functional aspects for deposition systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   providing an integrated circuit device;
   forming an undoped insulating layer over the integrated circuit device;
   forming a thin insulating layer over the undoped insulating layer having a dopant level within a range of dopant levels for preventing lateral etch by depositing the thin insulating layer with a flow of dopant between about thirty percent to about fifty percent of a bulk flow of the dopant;

forming a doped insulating layer over the thin insulating layer by depositing the doped insulating layer with the bulk flow of the dopant;

forming a recess by etching only the undoped insulating layer, the thin insulating layer and the doped insulating layer, the thin insulating layer including a thin insulating layer sidewall sloped less than a sidewall of the undoped insulating layer and a sidewall of the doped insulating layer; and forming a contact in the recess.

2. The method as claimed in claim 1 wherein forming the thin insulating layer comprises forming a lightly doped thin insulating layer between the undoped insulating layer and the doped insulating layer.

3. The method as claimed in claim 1 wherein forming the doped insulating layer comprises depositing a doped TEOS layer.

4. The method as claimed in claim 1 wherein forming the contact comprises forming a tungsten contact.

5. A method of manufacture of an integrated circuit system with contact film comprising:

forming an integrated circuit device having a semiconductor layer on a substrate;

depositing an undoped insulating layer over the substrate;

depositing a thin insulating layer on the undoped insulating layer having a dopant level within a range of dopant levels for preventing lateral etch by depositing the thin insulating layer with a flow of dopant between about thirty percent to about fifty percent of a bulk flow of the dopant;

depositing a doped insulating layer on the thin insulating layer by depositing the doped insulating layer with the bulk flow of the dopant;

forming a recess by etching only the undoped insulating layer, the thin insulating layer and the doped insulating layer, the thin insulating layer including a thin insulating layer sidewall sloped less than a sidewall of the undoped insulating layer and a sidewall of the doped insulating layer; and depositing a contact in the recess.

6. The method as claimed in claim 5 wherein depositing the thin insulating layer comprises depositing a lightly doped thin insulating layer having dopants combined with the dielectric by a deposition system.

7. The method as claimed in claim 5 wherein depositing the contact comprises forming a graduated profile.

8. The method as claimed in claim 5 further comprising depositing an interconnect layer over the contact interconnecting the integrated circuit device.

* * * * *